(12) United States Patent
Nakamura et al.

(10) Patent No.: US 8,945,336 B2
(45) Date of Patent: Feb. 3, 2015

(54) WIRING SUBSTRATE AND SEMICONDUCTOR DEVICE

(71) Applicant: Shinko Electric Industries Co., Ltd., Nagano-ken (JP)

(72) Inventors: Atsushi Nakamura, Nagano-ken (JP); Mitsuyoshi Imai, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 13/926,214

(22) Filed: Jun. 25, 2013

(65) Prior Publication Data

US 2014/0001648 A1 Jan. 2, 2014

(30) Foreign Application Priority Data

Jun. 29, 2012 (JP) .................................. 2012-147389

(51) Int. Cl.
*H01L 23/498* (2006.01)
*H01L 23/495* (2006.01)
*H01L 23/31* (2006.01)

(52) U.S. Cl.
CPC .... *H01L 23/49827* (2013.01); *H01L 23/49506* (2013.01); *H01L 23/49541* (2013.01); *H01L 23/49582* (2013.01); *H01L 2224/48091* (2013.01); *H01L 2224/73265* (2013.01); *H01L 2224/92247* (2013.01); *H01L 23/3107* (2013.01); *H01L 2924/3025* (2013.01)

USPC ................ 156/307.1; 257/774; 257/E23.011; 438/118

(58) Field of Classification Search
CPC . H01L 23/49827; H01L 24/27; H01I 23/3121
USPC .................. 257/668, 774, E23.011; 438/118; 156/307.1
See application file for complete search history.

(56) References Cited

U.S. PATENT DOCUMENTS

| 6,087,717 A * | 7/2000 | Ano et al. ....................... 257/684 |
| 2002/0094606 A1 * | 7/2002 | Fukutomi et al. ............. 438/110 |
| 2006/0284292 A1 * | 12/2006 | Cheng ........................... 257/678 |
| 2010/0320610 A1 * | 12/2010 | Huang et al. .................. 257/773 |

FOREIGN PATENT DOCUMENTS

JP 2007-149920 6/2007

* cited by examiner

*Primary Examiner* — Colleen A Matthews
*Assistant Examiner* — William Harriston
(74) *Attorney, Agent, or Firm* — Fish & Richardson P.C.

(57) ABSTRACT

A wiring substrate includes an adhesive layer, a wiring layer, and a support substrate. The adhesive layer includes a first surface and a second surface that is opposite to the first surface. The wiring layer is formed on the first surface of the adhesive layer. The support substrate is formed on the second surface of the adhesive layer. The wiring layer is partially exposed in a through hole extending through the adhesive layer and the support substrate in a thicknesswise direction. The support substrate is adhered to the adhesive layer in a removable manner.

10 Claims, 10 Drawing Sheets

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2012-147389, filed on Jun. 29, 2012, the entire contents of which are incorporated herein by reference.

FIELD

This disclosure relates to a wiring substrate and a semiconductor device.

BACKGROUND

LSI technology used for multimedia devices has been developed to increase the speed and amount of data that is transferred. Technology for mounting LSI chips on an electronic device with high density has been developed accordingly.

Various structures have been proposed for packages (semiconductor devices) that are applicable to high density mounting. For example, a ball grid array (BGA) package arranges ball terminals instead of lead terminals in a grid array on the surface of the package. Japanese Laid-Open Patent Publication No. 2007-149920 describes a tape ball grid array (TBGA) package that uses a tape-like substrate formed by a polyimide film or the like on a package base to increase the capacity and the number of pins.

FIG. 13 describes one example of a TBGA type semiconductor device in a related art. As illustrated in FIG. 13, a semiconductor device 100 includes a wiring substrate 110, a semiconductor element 120 mounted on the wiring substrate 110, an encapsulating resin 130 that encapsulates the semiconductor element 120 and the like, and solder balls.

The wiring substrate 110 includes a tape substrate 111 and an adhesive layer 112 formed on one side of the tape substrate 111. A wiring pattern 113 and bonding pads 114 are formed on the adhesive layer 112. Further, a solder resist layer 115 covering the wiring pattern 113 is formed on the adhesive layer 112. An adhesive agent (not illustrated) adheres the semiconductor element 120 to the solder resist layer 115. The semiconductor element 120 includes electrode pads 120P connected to bonding wires 122, which are electrically connected to the bonding pads 114. The encapsulating resin 130 is formed on the adhesive layer 112 to encapsulate the semiconductor element 120, the bonding wires 122, and the bonding pads 114.

A plurality of through holes 112X extend through the tape substrate 111 and the adhesive layer 112 at given locations. The solder balls 140, which are electrically connected to the wiring pattern 113, are arranged in the through holes.

SUMMARY

Electronic devices have become smaller and thinner. Thus, semiconductor devices need to be smaller and thinner accordingly. However, a decrease in the thickness of the tape substrate 111 lowers the mechanical strength of the tape substrate 111. This makes it difficult to handle the semiconductor device during manufacturing. Thus, it is difficult to decrease the thickness of the tape substrate 111 and thus the semiconductor device 100.

One aspect of the present invention is a wiring substrate including an adhesive layer, a wiring layer, and a support substrate. The adhesive layer includes a first surface and a second surface that is opposite to the first surface. A wiring layer is formed on the first surface of the adhesive layer. A support substrate is formed on the second surface of the adhesive layer. The wiring layer is partially exposed in a through hole extending through the adhesive layer and the support substrate in a thicknesswise direction. The support substrate is adhered to the adhesive layer in a removable manner.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

Figure 1A:
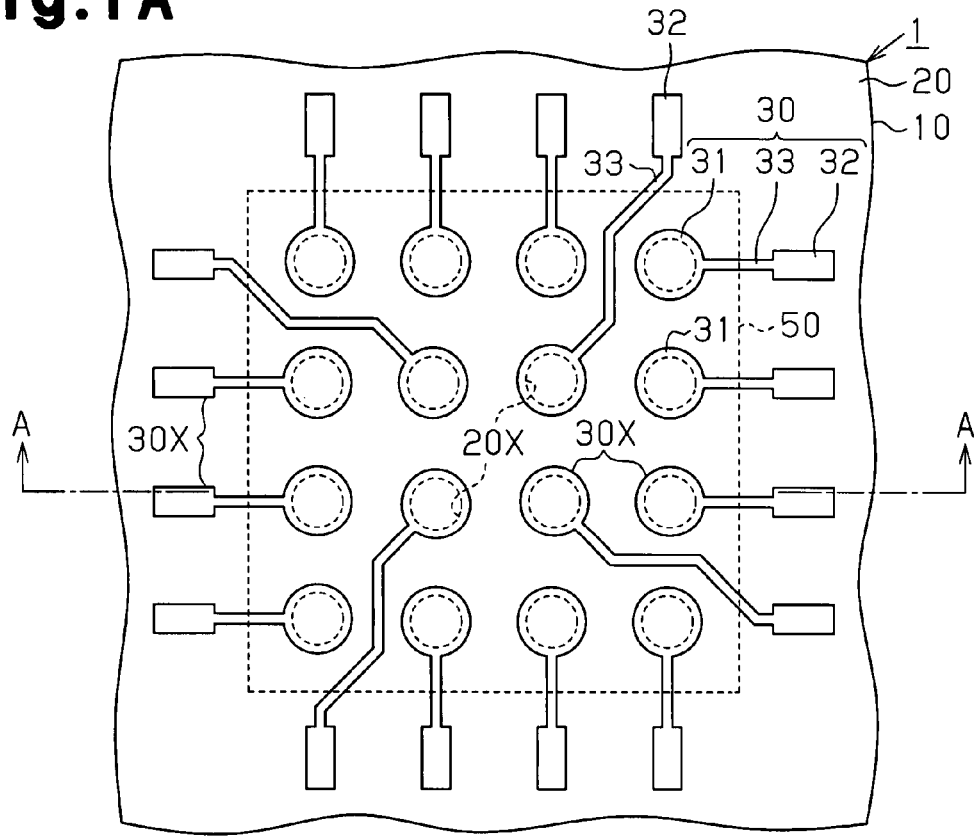
FIG. 1A is a schematic plan view illustrating a first embodiment of a wiring substrate.

Embodiments will now be described with reference to the drawings. Features or elements in the drawings are illustrated for simplicity and clarity and have not necessarily been drawn to scale. Hatching lines may be eliminated from the cross-sectional views to facilitate understanding of each element in a cross-sectional structure.

A first embodiment will now be described with reference to FIGS. 1A to 5D.

Figure 1B:
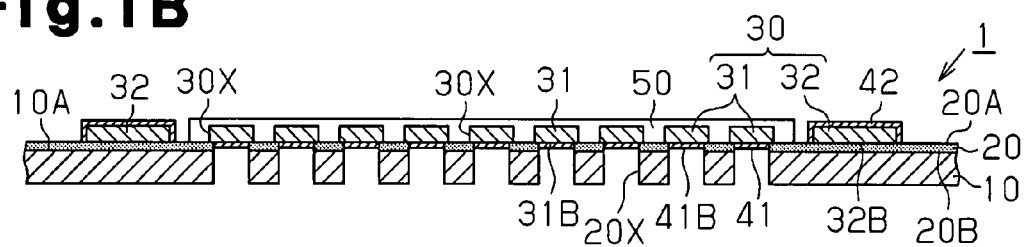
FIG. 1B is a schematic cross-sectional view of the wiring substrate taken along line A-A in FIG. 1A.

As illustrated in FIG. 1B, the wiring substrate 1 includes a sheet of a support substrate 10, an adhesive layer 20, a wiring layer 30, plating layers 41 and 42, and a solder resist layer 50. FIG. 1A is a plan view taken from above of the wiring substrate 1 illustrated in FIG. 1B. FIG. 1A does not depict all of the elements illustrated in FIG. 1B.

The support substrate 10 may be, for example, a tape substrate. Such a tape substrate may be, for example, a resin film, such as a polyimide (PI) film or a polyphenylene sulfide (PPS) film, or a glass plate. The support substrate 10 is, for example, tetragonal as viewed from above. Further, the support substrate 10 may have a thickness of, for example, generally 50 to 75 μm.

As illustrated in FIG. 1B, the adhesive layer 20 includes an upper surface 20A (first surface) and a lower surface 20B (second surface). The adhesive layer 20 is formed on an upper surface 10A of the support substrate 10. In other words, the support substrate 10 is formed on the lower surface 20B of the adhesive layer 20. The wiring layer 30 is formed on the upper surface 20A of the adhesive layer 20. The adhesive layer 20 functions to adhere the wiring layer 30 and the support substrate 10. However, the adhesive layer 20 is removable from the support substrate 10. In other words, the support substrate 10 is adhered in a removable manner to the adhesive layer 20. In contrast, the adhesive layer 20 is firmly adhered to the wiring layer 30. In this manner, the adhesive layer 20 has a first adhesive force that adheres the wiring layer 30 to the adhesive layer 20 and a second adhesive force that adheres the support substrate 10 to the adhesive layer 20, in which the first adhesive force is stronger than the second adhesive force. In other words, the peel strength of the wiring layer 30 relative to the adhesive layer 20 is stronger than the peel strength of the support substrate 10 relative to the adhesive layer 20. For example, the peel strength of the wiring layer 30 relative to the adhesive layer 20 is approximately 0.6 kgf/cm, whereas the peel strength of the support substrate 10 relative to the adhesive layer 20 is approximately 0.15 kgf/cm. The peel strength (removal strength) corresponds to the adhesive force between a subject (in this case, the wiring layer 30 or the support substrate 10) and an insulative layer (in this case, the adhesive layer 20). The peel strength is expressed by the force (kgf/cm) required to remove the subject by a width of 1 cm from the insulative layer when pulling the subject from the insulative layer in the vertical direction. Accordingly, the adhesive force (adhesion strength) between the subject and the insulative layer increases as the peel strength increases.

For example, an epoxy, polyimide, or silicone thermosetting adhesive and the like may be used as the material of the adhesive layer 20. Further, an adhesive having a property that decreases the adhesive force relative to a resin material when undergoing a heat treatment may be used as the material of the adhesive layer 20. The adhesive layer 20 may have a thickness of, for example, generally 5 to 20 μm (preferably, 10 to 12 μm).

Through holes 20X extend through the support substrate 10 and the adhesive layer 20 in the thicknesswise direction at given locations (in FIG. 1B, nine locations). The through holes 20X partially expose a lower surface 31B of the wiring layer 30. The lower surface 31B of the wiring layer 30 exposed in each through hole 20X functions as an external connection pad. As illustrated in FIG. 1A, each through hole 20X is, for example, circular as viewed from above and has a diameter of, for example, generally 200 to 400 μm. Further, the through holes 20X are arranged in an array or a matrix as viewed from above.

As illustrated in FIG. 1A, the wiring layer 30 includes a plurality of external connection pads 31, a plurality of bonding pads 32, and a plurality of wiring patterns 33. Each wiring pattern 33 electrically connects one of the external connection pads 31 and one of the bonding pads 32. The pads 31 are arranged in a mount region in which a semiconductor element 60 (refer to FIG. 2) is mounted. The bonding pads 32 are arranged outside the mount region. For example, an external connection pad 31 is arranged on one end of a wiring pattern 33, and a bonding pad 32 is formed on the other end of the wiring pattern 33. Copper (Cu) or a copper alloy, for example, may be used as the material for the external connection pads 31, the bonding pads 32, and the wiring patterns 33. Further, the external connection pads 31, the bonding pads 32, and the wiring patterns 33 may have a thickness of, for example, generally 15 to 30 μm.

Each external connection pad 31 is located above one of the through holes 20X. Each external connection pad 31 is overlapped with the corresponding through hole 20X as viewed from above. Like the through holes 20X, each pad 31 is circular as viewed from above. Further, each external connection pad 31 is larger in size than the through hole 20X, as viewed from above. Thus, a peripheral edge of the lower surface 31B of each pad 31 is located on the adhesive layer 20, and the remaining portion of the lower surface 31B is exposed in the corresponding through hole 20X. Each external connection pad 31 may have a diameter of, for example, generally 250 to 450 μm. Further, like the through holes 20X, the external connection pads 31 are arranged in an array or a matrix as viewed from above.

The lower surface 31B of each pad 31 is roughened to include microscopic ridges and valleys. The external connection pads 31 are separated from one another by through openings 30X.

Referring to FIG. 1A, the bonding pads 32 are arranged, for example, along the periphery (contour) of the solder resist layer 50. Each bonding pad 32 is, for example, tetragonal as viewed from above. Further, each bonding pad 32 has a size of, for example, generally 150 μm×100 μm. The bonding pads 32 are separated from one another by the through openings 30X. Referring to FIG. 1B, a lower surface 32B of each bonding pad 32 is roughened to include microscopic ridges and valleys. The lower surface 32B is entirely adhered to the upper surface 20A of the adhesive layer 20.

The plating layer 41 covers the lower surface 31B of each pad 31 exposed in the through hole 20X, which extends through the support substrate 10 and the adhesive layer 20. The plating layer 41 includes a lower surface 41B. External connection terminals 65 (refer to FIG. 2), such as solder balls and lead pins, are connected to the lower surface 41B of the plating layer 41. An example of the plating layer 41 is a metal layer obtained by sequentially stacking a nickel (Ni) layer and a gold (Au) layer from the lower surface 31B of the pad 31. Further, the plating layer 41 may be a metal layer obtained by sequentially stacking an Ni layer, a palladium (Pd) layer, and an Au layer from the lower surface 31B of the pad 31, a metal layer obtained by sequentially stacking an Ni layer, a Pd layer, and a silver (Ag) layer from the lower surface 31B of the pad 31, or a metal layer obtained by sequentially stacking an Ni layer, a Pd layer, an Ag layer, and an Au layer from the lower surface 31B of the pad 31. The Ni layer may include Ni or an Ni alloy. The Au layer may include Au or an Au alloy. The Pd layer may include Pd or a Pd alloy. The Ag layer may include Ag or an Ag alloy. The plating layer 41 may have a thickness that is less than that of the adhesive layer 20. For example, when the plating layer 41 is an Ni/Au layer, the Ni layer may have a thickness of generally 0.05 to 1 μm, and the Au layer may have a thickness of 0.1 to 1 μm. When the plating layer 41 covers the pads 31, the plating layer 41 functions as an external connection pad.

The plating layer 42 covers the surfaces (upper surface and side surface) of the bonding pads 32. One example of the plating layer 42 is a metal layer obtained by sequentially stacking an Ni layer and an Au layer from the surface of the bonding pad 32. Further, the plating layer 42 may be a metal layer obtained by sequentially stacking an Ni layer, a Pd layer, and an Au layer from the surface of the bonding pad 32, a metal layer obtained by sequentially stacking an Ni layer, a Pd layer, and an Ag layer from the surface of the bonding pad 32, or a metal layer obtained by sequentially stacking an Ni layer, a Pd layer, an Ag layer, and an Au layer from the surface of the bonding pad 32. For example, when the plating layer 42 is an Ni/Au layer, the Ni layer may have a thickness of generally 0.05 to 1 μm, and the Au layer may have a thickness of 0.1 to 1 μm. When the plating layer 42 covers the bonding pads 32, the plating layer 42 functions as a bonding pad.

The solder resist layer 50 is formed on the upper surface 20A of the adhesive layer 20 to cover the pads 31. The thickness from an upper surface of each pad 31 to an upper surface of the solder resist layer 50 may be, for example, generally 5 to 15 μm. An epoxy or acrylic insulative resin, for example, may be used as the material of the solder resist layer 50.

Figure 2:
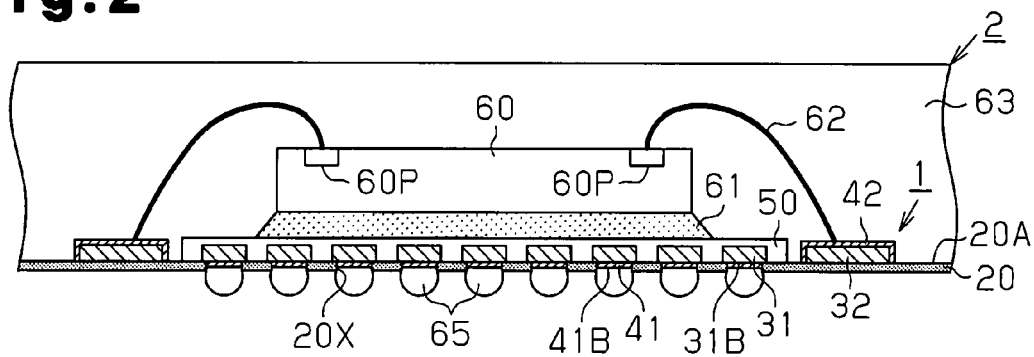
FIG. 2 is a schematic cross-sectional view illustrating a semiconductor device in the first embodiment.

As illustrated in FIG. 2, a semiconductor device 2 includes the wiring substrate 1, the semiconductor element 60, the encapsulating resin 63, and the external connection terminals 65. The support substrate 10 illustrated in FIG. 1B is removed from the adhesive layer 20 of the wiring substrate 1. In the semiconductor device 2, the adhesive layer 20 is completely hardened, and the exposed lower surface 20B is not adhesive. Further, the adhesive layer 20 functions as an insulative layer that insulates adjacent plating layers 41 (external connection terminals 65).

The semiconductor element 60 is adhered to an upper surface of the solder resist layer 50 by an adhesive 61. The semiconductor element 60 includes electrode pads 60P. Bonding wires 62 electrically connect the electrode pads 60P to the bonding pads 32 (plating layer 42) of the wiring substrate 1. In other words, the semiconductor element 60 is wire-bonded to the wiring substrate 1.

The semiconductor element 60 is, for example, tetragonal as viewed from above. The semiconductor element 60 has a size of, for example, generally 9 mm×9 mm as viewed from above and a thickness of, for example, generally 50 to 200 μm. A light emitting element such as a light emitting diode, an IC chip, or an LSI chip, for example, may be used as the semiconductor element 60. For example, a die attach film, formed from an epoxy resin, or an Ag paste may be used as the adhesive 61. Further, fine wires of gold, copper, or aluminum, for example, may be used as the bonding wires 62.

The encapsulating resin 63 is formed on the upper surface 20A of the adhesive layer 20 to cover the semiconductor element 60, the bonding wires 62, the bonding pads 32, the plating layer 42, and the like. An epoxy insulative resin, for example, may be used as the material of the encapsulating resin 63. The encapsulating resin 63 may be obtained by, for example, molding resin in a transfer mold process, a compression mold process, or an injection mold process. The encapsulating resin 63 formed on the adhesive layer 20 may have a thickness of, for example, generally 300 to 400 μm.

The external connection terminals 65 are formed on the lower surface 41B of the plating layer 41 of the wiring substrate 1. The external connection terminals 65 are electrically connectable to external connection pads arranged in, for example, a mounting substrate such as a motherboard (not illustrated). Solder balls or lead pins, for example, may be used as the external connection terminals 65. In the present example, solder balls are used as the external connection terminals 65.

A method for manufacturing the wiring substrate 1 will now be described with reference to FIGS. 3A to 4D. FIGS. 3A to 3E and 4A to 4D are schematic cross-sectional views taken along line A-A in FIG. 1A.

Figure 3A:
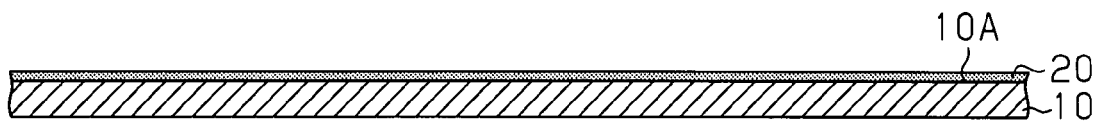
FIGS. 3A to 3E and 4A to 4D are schematic cross-sectional views illustrating procedures for manufacturing the wiring substrate in the first embodiment.

Referring to FIG. 3A, the support substrate 10 is first prepared. The adhesive layer 20 is formed on the upper surface 10A of the support substrate 10. Here, a batch of support substrates 10 (together with the adhesive layers 20) is obtained from a large substrate. For example, a batch of support substrates 10 that are continuously connected in strips are transferred between reels. However, FIGS. 3A to 5D illustrate only one wiring substrate 1 (or one semiconductor device 2) for simplicity and clarity. The adhesive layer 20 may be formed, for example, by stacking a resin film on the support substrate 10 or by applying a liquid or paste of resin to the support substrate 10. A thermosetting resin, for example, may be used as such resin of the adhesive layer 20. In the step illustrated in FIG. 3A, the adhesive layer 20 is used in a B-stage state (semi-cured state).

Figure 3B:
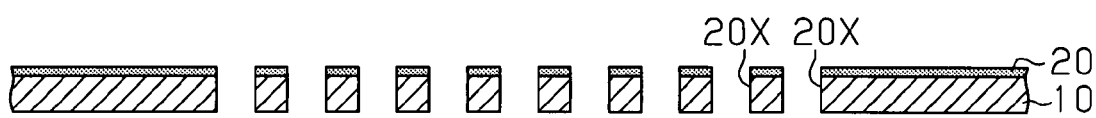

In the next step illustrated in FIG. 3B, the through holes 20X are formed in the adhesive layer 20 and the support substrate 10 at given locations. The through holes 20X may be formed through stamping or etching.

Figure 3C:
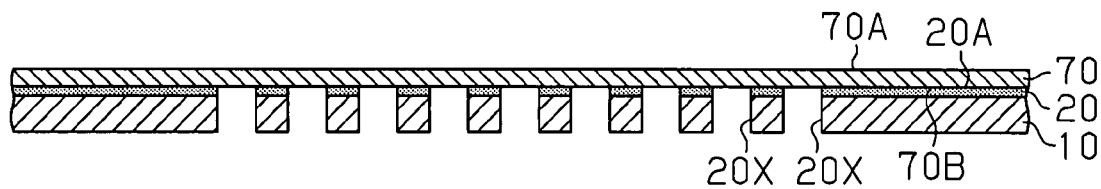

In the step illustrated in FIG. 3C, a metal foil 70, which becomes the wiring layer 30 (refer to FIG. 1B), is adhered to the upper surface 20A of the adhesive layer 20. Thermal compression bonding, for example, is performed to laminate the metal foil 70 to the upper surface 20A of the adhesive layer 20. Before laminating the metal foil 70, a lower surface 70B of the metal foil 70 is roughened. This increases the adhesive force between the metal foil 70 and the adhesive layer 20. After laminating the metal foil 70, for example, a thermal curing process is performed under a temperature atmosphere of generally 150° C. to 200° C. to harden the adhesive layer 20. The hardening of the adhesive layer 20 firmly adheres the metal foil 70 to the adhesive layer 20. An adhesive having a property that decreases the adhesive force relative to the support substrate 10 through a heating process (thermal curing process), for example, may be used as the adhesive layer 20. A copper foil, for example, may be used as the metal foil 70. Then, when necessary, the upper surface 70A of the metal foil 70 may be polished and flattened by performing mechanical polishing, chemical mechanical polishing (CMP), or the like.

Figure 3D:
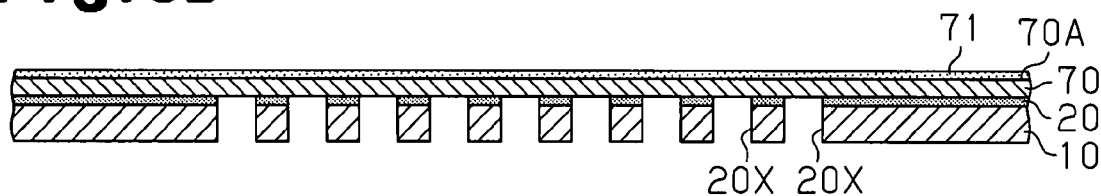
Figure 3E:
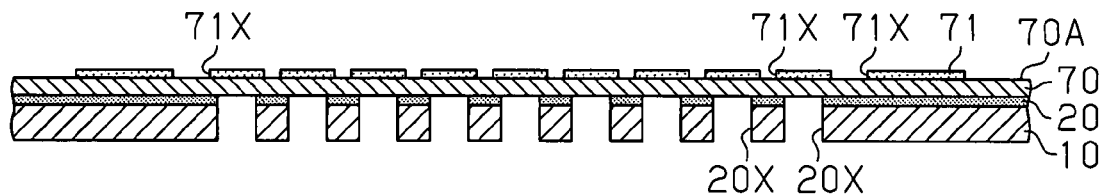

In the next step illustrated in FIG. 3D, a resist layer 71 is formed to entirely cover the upper surface 70A of the metal foil 70. Then, in the step illustrated in FIG. 3E, openings 71X corresponding to the openings 30X illustrated in FIG. 1B are formed at given locations on the resist layer 71. The material of the resist layer 71 may have an etching resistant property. For example, a photosensitive dry film resist or a liquid photoresist (e.g., dry film resist such as novolac resin or acrylic resin, or liquid resist) may be used as the material of the resist layer 71. For example, when using a photosensitive dry film resist, thermal compression bonding is performed to laminate a dry film onto the upper surface 70A of the metal foil 70. Then, the dry film is patterned by undergoing exposure and development to form the resist layer 71 that includes the openings 71X. When using a liquid photoresist, similar procedures are performed to form the resist layer 71 that includes the openings 71X.

Figure 4A:
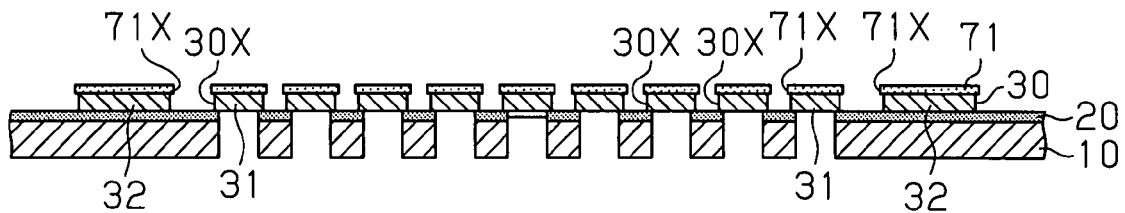

In the next step illustrated in FIG. 4A, the upper surface 70A of the metal foil 70 is etched using the resist layer 71 as an etching mask to form the wiring layer 30 that includes the pads 31, the bonding pads 32, and the wiring patterns 33 (refer to FIG. 1A). More specifically, the upper surface 70A of the metal foil 70 exposed in the openings 71X of the resist layer 71 is etched to form the openings 30X that obtain the pads 31, the bonding pads 32, and the wiring patterns 33 (refer to FIG. 1A). In this manner, a subtractive process is performed to form the wiring layer 30. When performing wet etching (isotropic etching) to pattern the metal foil 70, the etching liquid used for the wet etching may be selected in accordance with the material of the metal foil 70. For example, when using a copper foil as the metal foil 70, aqueous ferric chloride may be used as the etching liquid. In this case, spray etching may be performed to pattern the upper surface 70A of the metal foil 70.

Figure 4B:
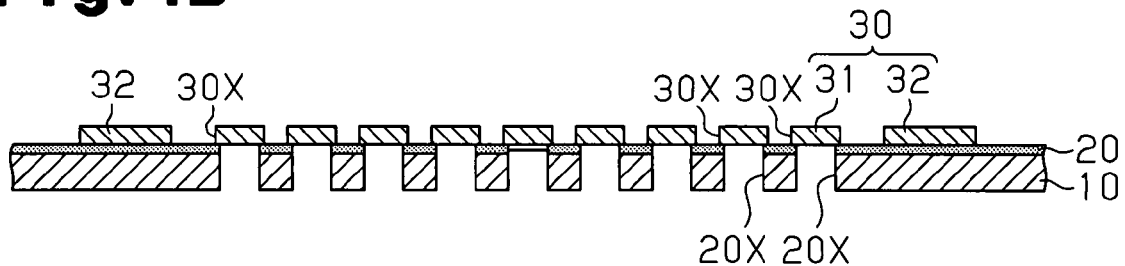

Then, in the step illustrated in FIG. 4B, the resist layer 71 illustrated in FIG. 4A is removed with, for example, an acrylic removal liquid.

Figure 4C:
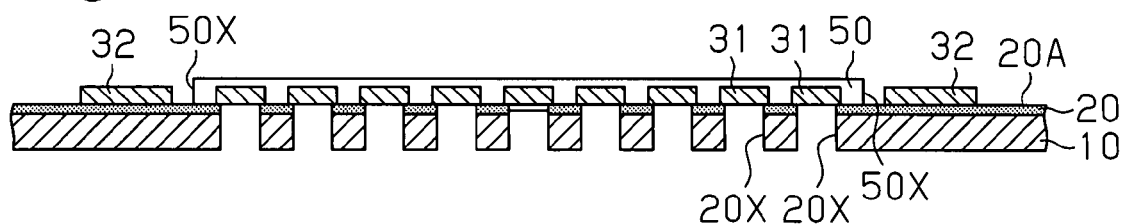

In the next step illustrated in FIG. 4C, the solder resist layer 50 is formed on the upper surface 20A of the adhesive layer 20 to cover the surfaces (upper surface and side surface) of each pad 31. For example, a printing process is performed to apply a paste of photosensitive resin to the upper surface 20A of the adhesive layer 20 and form the solder resist layer 50 that entirely covers the upper surface 20A of the adhesive layer 20. Then, a photolithography process is performed to expose and develop the solder resist layer 50 and form the openings 50X that expose the bonding pads 32 or the like.

Figure 4D:
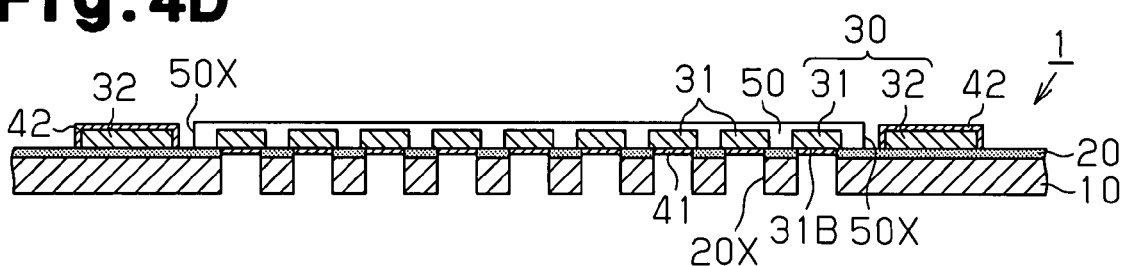

In the step illustrated in FIG. 4D, electrolytic plating is performed using each of the solder resist layer 50 and the support substrate 10 as a plating mask and the wiring layer 30 (pads 31 and bonding pads 32) as a plating power supply layer. The electrolytic plating forms the plating layer 41 on the lower surface 31B of the pads 31 exposed in the through holes 20X, and forms the plating layer 42 on the surfaces (upper surface and side surface) of the bonding pads 32 exposed in the openings 50X of the solder resist layer 50. For example, when the plating layers 41 and 42 are Ni/Au layers, electrolytic plating is performed to sequentially stack an Ni layer and an Au layer on the wiring layer 30 exposed in the through holes 20X and the openings 50X. The wiring substrate 1 illustrated in FIG. 1B is manufactured through the steps described above.

Figure 5A:
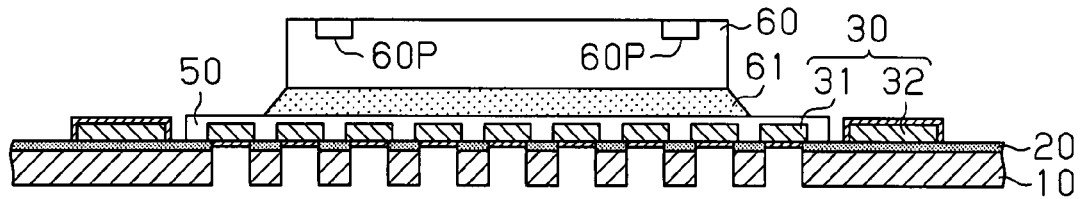
FIGS. 5A to 5D are schematic cross-sectional views illustrating procedures for manufacturing the semiconductor device in the first embodiment.

In the next step illustrated in FIG. 5A, the semiconductor element 60 is adhered with the adhesive 61 to the upper surface of the solder resist layer 50 of the wiring substrate 1 (die bonding). The semiconductor element 60 is mounted on the solder resist layer 50 with the electrode pads 60P located at the upper side. Then, in the step illustrated in FIG. 5B, the electrode pads 60P of the semiconductor element 60 are electrically connected (wire-bonded) to the bonding pads 32 (plating layer 42) with the bonding wires 62.

Figure 5B:
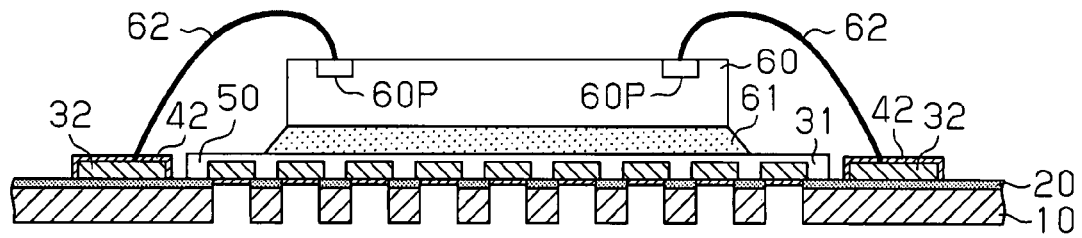
Figure 5C:
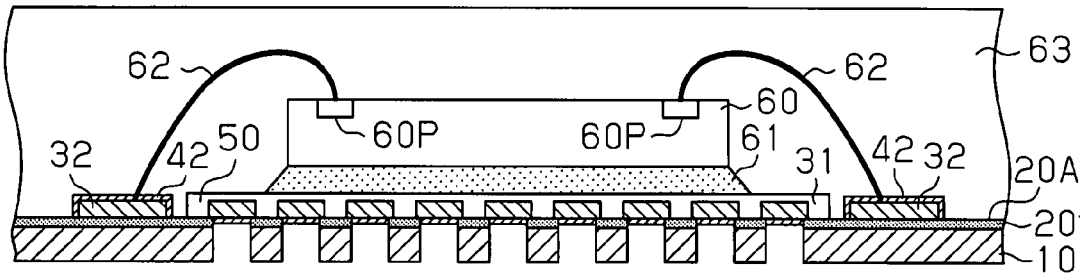

In the step illustrated in FIG. 5C, the encapsulating resin 63 is formed on the upper surface 20A of the adhesive layer 20 to encapsulate the semiconductor element 60, the bonding wires 62, the bonding pads 32, the plating layer 42, and the like. When using a molding resin having a thermosetting property as the material of the encapsulating resin 63, the structure illustrated in FIG. 5B is set in a molding die. The molding die is then pressurized (e.g., 5 to 10 MPa), and fluidized molding resin is charged into the molding die. Subsequently, the resin is heated to, for example, approximately 180° C. and hardened to form the encapsulating resin 63. To charge the molding resin, for example, a transfer molding process, a compression molding process, or an injection performing process may be performed. A liquid resin potting may be used to form the encapsulating resin 63.

Figure 5D:
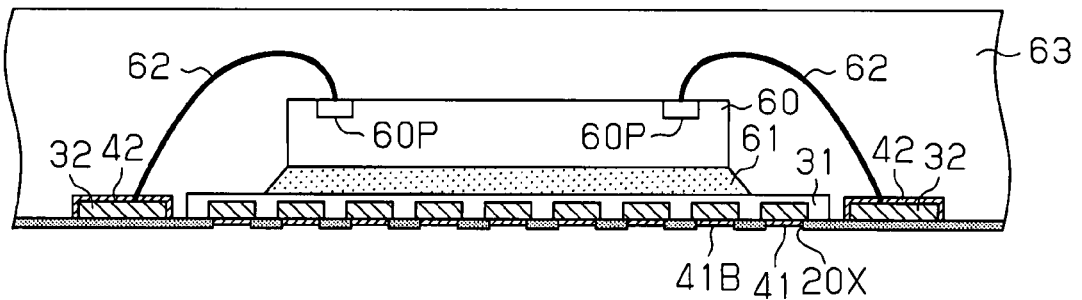

In the next step illustrated in FIG. 5D, the support substrate 10 illustrated in FIG. 5C is removed from the adhesive layer 20. For example, the support substrate 10 is mechanically removed from the adhesive layer 20. The removal of the support substrate 10, which is relatively thick to ensure structural mechanical strength during manufacturing, from the wiring substrate 1 allows for the semiconductor device 2 to be reduced in thickness. Further, since the encapsulating resin 63 is formed in the preceding step, the encapsulating resin 63 ensures sufficient mechanical strength for the structure illustrated in FIG. 5D. Accordingly, even if the support substrate 10 is removed from the wiring substrate 1 in the step illustrated in FIG. 5D, the handling convenience during transportation of the wiring substrate 1 is not adversely affected. The adhesive layer 20 from which the support substrate 10 is removed is completely hardened and thus not adhesive.

Subsequently, the external connection terminals 65 (refer to FIG. 2) are formed on the lower surface 41B of the plating layer 41. For example, after applying flux to the lower surface 41B of the plating layer 41, the external connection terminals 65 (here, solder balls) are arranged on the lower surface 41B. Then, a reflow process is performed under a temperature of generally 240° C. to 260° C. to fix the external connection terminals 65 to the lower surface 41B. The encapsulating resin 63 and the adhesive layer 20 of the structure including the external connection terminals 65 are cut to obtain a plurality of semiconductor devices 2. This obtains the semiconductor device 2 illustrated in FIG. 2.

The first embodiment has the advantages described below.

(1) The support substrate 10 is adhered in a removable manner to the adhesive layer 20. After the encapsulating resin 63 is formed on the adhesive layer 20, the support substrate 10 is removed from the adhesive layer 20 (wiring substrate 1). The removal of the support substrate 10 decreases the thickness of the entire wiring substrate 1 and the thickness of the entire semiconductor device 2. Accordingly, the thickness of the wiring substrate 1 and the thickness of the semiconductor device 2 may be deceased. Further, after ensuring sufficient mechanical strength for the semiconductor device 2 with the encapsulating resin 63 during manufacturing, the support substrate 10 is removed from the wiring substrate 1. Thus, the removal of the support substrate 10 does not affect handling convenience of the wiring substrate 1 (semiconductor device 2) during transportation. Moreover, the support substrate 10 ensures the mechanical strength until the encapsulating resin 63 is formed. Thus, while allowing for a decrease in the thickness of the semiconductor device 2, the same level of handling convenience as the related art may be maintained during manufacturing.

Further, the support substrate 10 is consequently removed. Thus, even when the support substrate 10 is thicker than the tape substrate 111 used in the related art, enlargement of the semiconductor device 2 is suppressed. Accordingly, the formation of the support substrate 10 with a greater thickness than the tape substrate 111 of the related art may improve the handling convenience during manufacturing before the formation of the encapsulating resin 63.

(2) In the semiconductor device 100 of the related art, when the wire pitch is narrowed as the density of the semiconductor device 100 increases, the diameter of the through holes 112X is decreased. However, when the diameter of the through holes 112X decreases, the reliability for the electric connection between the solder balls 140 and the wiring pattern 113 via the through holes 112X has a tendency of decreasing. Further, when forming a relatively thick tape substrate 111 to ensure mechanical strength while decreasing the diameter of the through holes 112X, the solder balls 140 formed below the through holes 112X may not reach the wiring pattern 113 formed above the through holes 112X. When performing a reflow process under such a situation in which the solder balls 140 do not reach the wiring pattern 113, the solder balls 140 cannot be bonded in a normal manner with the wiring pattern 113.

To suppress defective bonding of the solder balls 140 with the wiring pattern 113, plug plating may be performed to form a conductor of copper or the like on the lower surface of the wiring pattern 113 and to thereby improve the reliability for the electric connection between the solder balls 140 and the wiring pattern 113 (refer to, for example, Japanese Laid-Open Patent Publication No. 2007-149920). However, when the tape substrate 111 is thick, the plug plating is increased in thickness. This prolongs the processing time and increase the manufacturing cost.

In contrast, in the present embodiment, after removal of the support substrate 10, the external connection terminals 65 are formed on the lower surface 41B of the plating layer 41 exposed in the through holes 20X of the adhesive layer 20. Thus, when forming the external connection terminals 65, the support substrate 10 has been removed. Accordingly, the through holes 20X are shallow. That is, when forming the external connection terminals 65, the distance from the lower end of each through hole 20X (open end of the through hole 20X) to the upper end of the through hole 20X (lower surface 41B of plating layer 41) is short. This facilitates the formation of the external connection terminals 65 filled into the through holes 20X. As a result, the reliability of the electric connection between the pads 31 (plating layer 41) and the external connection terminals 65 may be improved compared to the semiconductor device 100 of the related art.

Further, high reliability of the electric connection between the pads 31 (plating layer 41) and the external connection terminals 65 may be obtained without forming a plug plating in the through holes 20X. Thus, the reliability of the electric connection between the pads 31 and the external connection terminals 65 may be improved while suppressing the processing time and manufacturing costs.

A second embodiment will now be described with reference to FIGS. 6 to 11D.

Figure 6:
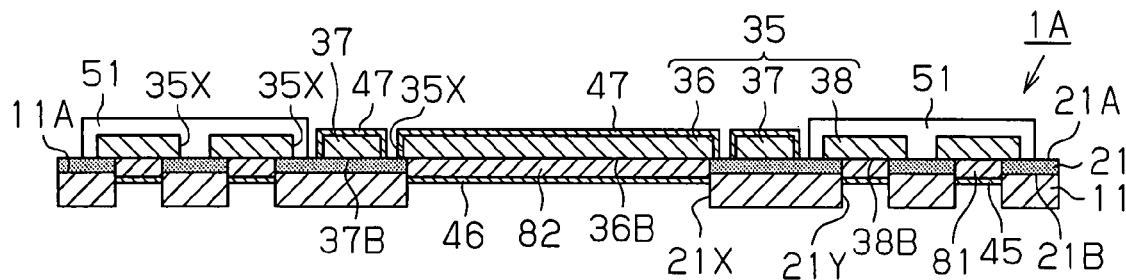
FIG. 6 is a schematic cross-sectional view illustrating a second embodiment of a wiring substrate.

Referring to FIG. 6, a wiring substrate 1A includes a sheet of a support substrate 11, and an adhesive layer 21, a wiring layer 35, metal layers 81 and 82, plating layers 45, 46, and 47, and a solder resist layer 51. The wiring layer 35 includes a die pad 36, bonding pads 37, and pads 38.

A tape substrate, for example, may be used as the support substrate 11. Such a tape substrate may be, for example, a resin film, such as a PI film or a PPS film, or a glass plate. The support substrate 11 has a thickness of, for example, 50 to 75 μm. The support substrate 11 is, for example, tetragonal as viewed from above.

The adhesive layer 21 includes an upper surface 21A (first surface) and a lower surface 21B (second surface). The adhesive layer 21 is formed on an upper surface 11A of the support substrate 11. In other words, the support substrate 11 is formed on the lower surface 21B of the adhesive layer 21. The wiring layer 35 (die pad 36, bonding pads 37, and pads 38) is formed on the upper surface 21A of the adhesive layer 21. The adhesive layer 21 functions to adhere the wiring layer 35 and the support substrate 11. However, the adhesive layer 21 is removable from the support substrate 11. In other words, the support substrate 11 is adhered in a removable manner to the adhesive layer 21. In contrast, the adhesive layer 21 is firmly adhered to the wiring layer 35. In this manner, the adhesive layer 21 has a first adhesive force that adheres the wiring layer 35 to the adhesive layer 21 and a second adhesive force that adheres the support substrate 11 to the adhesive layer 21, in which, the first adhesive force is stronger than the second adhesive force. In other words, the peel strength of the wiring layer 35 relative to the adhesive layer 21 is stronger than the peel strength of the support substrate 11 relative to the adhesive layer 21. For example, the peel strength of the wiring layer 35 relative to the adhesive layer 21 is approximately 0.6 kgf/cm, whereas the peel strength of the support substrate 11 relative to the adhesive layer 21 is approximately 0.1 kgf/cm.

For example, an epoxy, polyimide, or silicone thermosetting adhesive and the like may be used as the material of the adhesive layer 21. Further, an adhesive having a property that decreases the adhesive force relative to a resin material when undergoing a heat treatment may be used as the material of the adhesive layer 21. The adhesive layer 21 may have a thickness of, for example, generally 5 to 20 μm (preferably, 10 to 12 μm).

A through portion 21X and a plurality of (four in FIG. 6) through holes 21Y extend through the support substrate 11 and the adhesive layer 21. The through portion 21X extends through a central portion of the support substrate 11 and the adhesive layer 21 as viewed from above. The through portion 21X is located at a position corresponding to the mount region of a semiconductor element 60 (refer to FIG. 7). Further, the through portion 21X exposes a portion of a lower surface 36B of the die pad 36. Although not illustrated in the drawings, the through portion 21X is, for example, tetragonal as viewed from above.

The through holes 21Y are formed in a region surrounding the through portion 21X (i.e., region outside the mount region). The through holes 21Y extend through the support substrate 11 and the adhesive layer 21 in the thicknesswise direction. The through holes 21Y expose a portion of a lower surface 38B of each pad 38. Although not illustrated in the drawings, each through hole 21Y is, for example, circular as viewed from above. The through holes 21Y may have a diameter set to, for example, 200 to 400 μm. The through holes 21Y may be arranged, for example, along the periphery of the through portion 21X as viewed from above.

In this manner, the wiring layer 35 includes the die pad 36 formed in the mount region, the bonding pads 37 formed on the adhesive layer 21 between the through portion 21X and the through holes 21Y, and the external connection pads 38 formed in a region outside the bonding pads 37. Copper or a copper alloy, for example, may be used as the material for the die pad 36, the bonding pads 37, and the pads 38. Further, the die pad 36, the bonding pads 37, and the pads 38 may each have a thickness of, for example, generally 15 to 30 μm. The wiring layer 35 may include a wiring pattern electrically connecting the bonding pads 37 and the pads 38.

The die pad 36 is located above the through portion 21X. That is, the die pad 36 is overlapped with the through portion 21X as viewed from above. Further, like the through portion 21X, the die pad 36 is, for example, tetragonal as viewed from above. Further, the die pad 36 has a larger size than the through portion 21X as viewed from above. Thus, a peripheral edge of the lower surface 36B of the die pad 36 is located on the adhesive layer 21, and the remaining portion of the lower surface 36B is exposed in the through portion 21X. The lower surface 36B of the die pad 36 is roughened to include microscopic ridges and valleys.

The bonding pads 37 are arranged, for example, along the periphery (contour) of the die pad 36. Each bonding pad 37 is, for example, tetragonal as viewed from above. Further, each bonding pad 37 has a size of, for example, generally 150 μm×100 μm. A lower surface 37B of each bonding pad 37 is roughened to include microscopic ridges and valleys. The bonding pads 37 are separated from the die pad 36 by openings 35X.

Each pad 38 is located above a corresponding one of the through holes 21Y. That is, each pad 38 is overlapped with the corresponding through hole 21Y as viewed from above. Further, like the through hole 21Y, each pad 38 is, for example, circular as viewed from above. Each pad 38 has a larger size than the through holes 21Y as viewed from above. Thus, a peripheral edge of the lower surface 38B of each pad 38 is located on the adhesive layer 21, and the remaining portion of the lower surface 38B is exposed in the corresponding through hole 21Y. Each pad 38 may have a diameter of, for example, generally 250 to 450 μm. Like the through holes 21Y, the pads 38 may be arranged, for example, along the periphery of the die pad 36 as viewed from above.

The lower surface 38B of each pad 38 is roughened to include microscopic ridges and valleys. The pads 38 are separated from one another by the openings 35X.

The metal layer 81 (first metal layer) covers the lower surface 38B of each pad 38 exposed in the corresponding through hole 21Y that extends through the support substrate 11 and the adhesive layer 21. Further, the metal layer 82 (second metal layer) covers the lower surface 36B of the die pad 36 exposed in the through portion 21X that extends through the support substrate 11 and the adhesive layer 21. The metal layers 81 and 82 project from the lower surface 21B of the adhesive layer 21. That is, the metal layers 81 and 82 are thicker than the adhesive layer 21. The metal layers 81 and 82 may have a thickness of, for example, 10 to 25 μm. Copper or copper alloy, for example, may be used as the material of the metal layers 81 and 82.

The plating layer 45 covers a lower surface of the metal layer 81. The plating layer 45 and the metal layer 81 function as external connection terminals used when mounting the wiring substrate 1A onto a mounting substrate such as a motherboard (not illustrated). The plating layer 46 covers a lower surface of the metal layer 82. The plating layer 46 and the metal layer 82 function as a heat radiation plate that radiates heat from the semiconductor element 60 (refer to FIG. 7) mounted on the die pad 36. An example of the plating layers 45 and 46 is a metal layer obtained by sequentially stacking a Ni layer and an Au layer from the lower surface of the corresponding metal layer 81 or 82. Further, the plating layers 45 and 46 may each be a metal layer obtained by sequentially stacking an Ni layer, a Pd layer, and an Au layer from the lower surface of the corresponding metal layer 81 or 82, a metal layer obtained by sequentially stacking an Ni layer, a Pd layer, and an Ag layer from the lower surface of the corresponding metal layer 81 or 82, or a metal layer obtained by sequentially stacking an Ni layer, a Pd layer, an Ag layer, and an Au layer from the lower surface of the corresponding metal layer 81 or 82. For example, when the plating layers 45 and 46 are Ni/Au layers, the Ni layer may have a thickness of generally 0.05 to 1 μm, and the Au layer may have a thickness of generally 0.1 to 1 μm.

The plating layer 47 covers the surfaces (upper surface and side surface) of the die pad 36 and the surfaces (upper surfaces and side surfaces) of the bonding pads 37. One example of the plating layer 47 is a metal layer obtained by sequentially stacking an Ni layer and an Au layer from the surface of the die pad 36 and the surface of each bonding pad 37. Further, the plating layer 47 may be a metal layer obtained by sequentially stacking an Ni layer, a Pd layer, and an Au layer from the surfaces of the die pad 36 and the bonding pads 37, a metal layer obtained by sequentially stacking an Ni layer, a Pd layer, and an Ag layer from the surfaces of the die pad 36 and the bonding pads 37, or a metal layer obtained by sequentially stacking an Ni layer, a Pd layer, an Ag layer, and an Au layer from the surfaces of the die pad 36 and the bonding pads 37. For example, when the plating layer 47 is an Ni/Au layer, the Ni layer may have a thickness of generally 0.05 to 1 μm, and the Au layer may have a thickness of generally 0.1 to 1 μm. When the plating layer 47 is formed, the plating layer 47 that covers the die pad 36 functions as a die pad, and the plating layer 47 that covers each bonding pad 37 functions as a bonding pad.

The solder resist layer 51 is formed on the upper surface 21A of the adhesive layer 21 to cover the pads 38. The thickness from an upper surface of each pad 38 to an upper surface of the solder resist layer 51 may be, for example, generally 5 to 15 μm. An epoxy or acrylic insulative resin, for example, may be used as the material of the solder resist layer 51.

Figure 7:
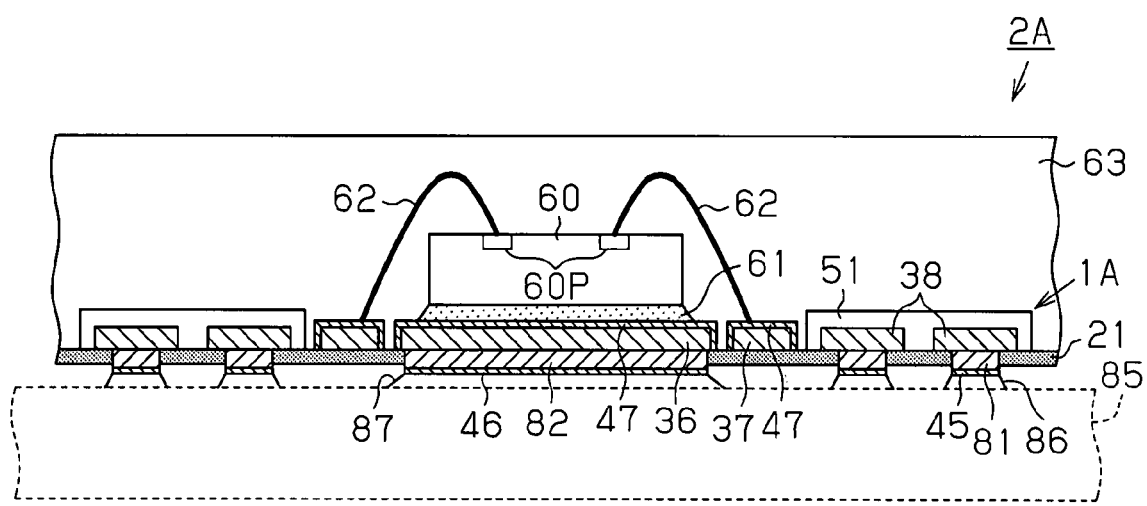
FIG. 7 is a schematic cross-sectional view illustrating a semiconductor device in the second embodiment.

As illustrated in FIG. 7, a semiconductor device 2A includes the wiring substrate 1A, the semiconductor element 60, and the encapsulating resin 63. The support substrate 11 illustrated in FIG. 6 is removed from the adhesive layer 21 of the wiring substrate 1A. In the semiconductor device 2A, the adhesive layer 21 is completely hardened, and thus the exposed lower surface 21B is not adhesive. Further, the adhesive layer 21 functions as an insulative layer that insulates adjacent metal layers 81 and insulates adjacent ones of the metal layers 81 and 82. FIG. 7 illustrates the semiconductor device 2A mounted on a mounting substrate 85 such as a motherboard.

The semiconductor element 60 is adhered to the die pad 36 (plating layer 47 formed on upper surface of the die pad 36). Bonding wires 62 electrically connect the electrode pads 60P of the semiconductor element 60 to the bonding pads 37 (plating layer 47 formed on upper surfaces of the bonding pads 37) of the wiring substrate 1A. In other words, the semiconductor element 60 is wire-bonded to the wiring substrate 1A.

The encapsulating resin 63 is formed on the upper surface 21A of the adhesive layer 21 to cover the semiconductor element 60, the bonding wires 62, the die pad 36, the bonding pads 37, the plating layer 47, and the like.

The metal layer 81 and the plating layer 45 are electrically connected to external connection pads arranged on the mounting substrate 85 by, for example, solders 86. Further, the metal layer 82 and the plating layer 46 are thermally coupled to a heat radiation wiring layer by, for example, a solder 87.

In this manner, the semiconductor device 2A is a land grid array (LGA) type semiconductor device (package), and includes the wiring substrate 1A (interposer) having a decreased thickness.

A method for manufacturing the wiring substrate 1A will now be described.

Figure 8A:
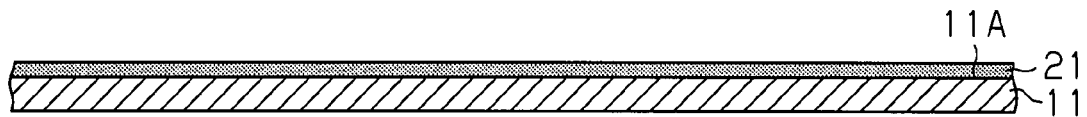
FIGS. 8A to 8E, 9A to 9D, and 10A to 10C are schematic cross-sectional views illustrating procedures for manufacturing the wiring substrate in the second embodiment.

Referring to FIG. 8A, the support substrate 11 is first prepared. The adhesive layer 21 is formed on the upper surface 11A of the support substrate 11. Here, a batch of support substrates 11 (together with the adhesive layers 21) is obtained from a large substrate. For example, a batch of support substrates 11 that are continuously connected in strips are transferred between reels. However, FIGS. 8A to 11D illustrate only one wiring substrate 1A (or one semiconductor device 2A) for simplicity and clarity. The adhesive layer 21 may be formed, for example, by stacking a resin film on the support substrate 11 or by applying a liquid or paste of resin to the support substrate 11. A thermosetting resin, for example, may be used as such resin of the adhesive layer 21. In the step illustrated in FIG. 8A, the adhesive layer 21 is used in a B-stage state (semi-cured state).

Figure 8B:

In the next step illustrated in FIG. 8B, the through portion 21X and the through holes 21Y are formed in the adhesive layer 21 and the support substrate 11 at given locations. The through portion 21X and the through holes 21Y may be formed through stamping or etching.

Figure 8C:
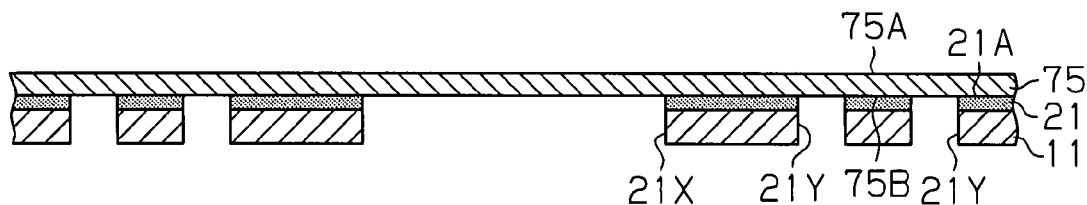

In the step illustrated in FIG. 8C, a metal foil 75, which becomes the wiring layer 35 (refer to FIG. 6), is adhered to the upper surface 21A of the adhesive layer 21. Thermal compression bonding, for example, is performed to laminate the metal foil 75 to the upper surface 21A of the adhesive layer 21. Before laminating the metal foil 75, a lower surface 75B of the metal foil 75 is roughened. This increases the adhesive force between the metal foil 75 and the adhesive layer 21. After laminating the metal foil 75, for example, a thermal curing process is performed under a temperature atmosphere of generally 150° C. to 200° C. to harden the adhesive layer 21. The hardening of the adhesive layer 21 firmly adheres the metal foil 75 to the adhesive layer 21. An adhesive having a property that decreases the adhesive force relative to the support substrate 11 through a heating process (thermal curing process), for example, may be used as the adhesive layer 21. A copper foil, for example, may be used as the metal foil 75. Then, when necessary, an upper surface 75A of the metal foil 75 may be polished and flattened by performing mechanical polishing, chemical mechanical polishing (CMP), or the like.

Figure 8D:
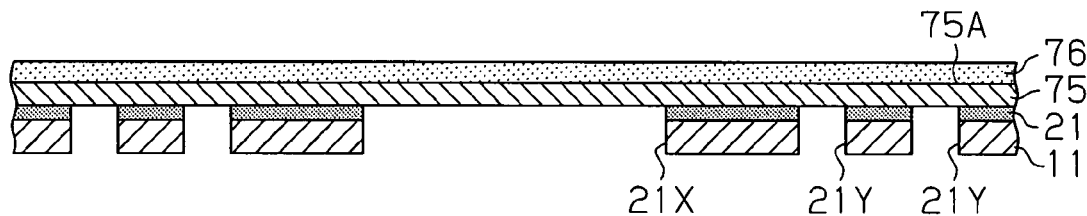

In the step illustrated in FIG. 8D, a masking material 76 is formed to entirely cover the upper surface 75A of the metal foil 75. The masking material 76 may be formed from a plating resistant material. A masking tape or a resist layer, for example, may be used as the masking material 76. Vinyl chloride or a PET film, for example, may be used as the material of the masking tape. For example, when using a masking tape as the masking material 76, the masking tape is adhered to the metal foil 75 to form the masking material 76. In this case, the masking material 76 (masking tape) is tentatively adhered to allow for easy removal from the metal foil 75 in a subsequent step.

Figure 8E:
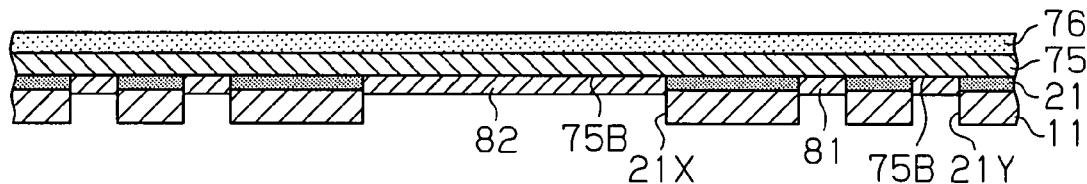

In the step illustrated in FIG. 8E, electrolytic plating (in this step, electrolytic copper plating) is performed using each of the support substrate 11 and the masking material 76 as a mask and the metal foil 75 as a plating power supply layer. The electrolytic plating forms the metal layer 81 on the lower surface 75B of the metal foil 75 exposed in each through hole 21Y, and forms the metal layer 82 on the lower surface 75B of the metal foil 75 exposed in the through portion 21X. The metal layers 81 and 82 are thicker than the adhesive layer 21. Accordingly, the lower surfaces of the metal layers 81 and 82 project downward from the lower surface 21B of the adhesive layer 21.

Figure 9A:
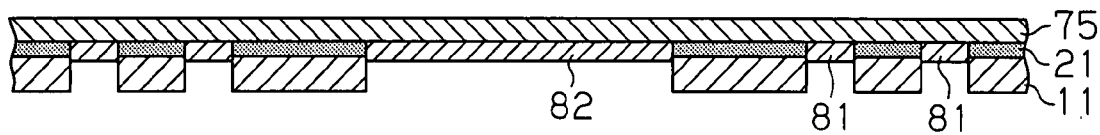

In the next step illustrated in FIG. 9A, the masking material 76 illustrated in FIG. 8E is removed. For example, when using a masking tape as the masking material 76, the masking material 76 (masking tape) is mechanically removed from the metal foil 75.

Figure 9B:
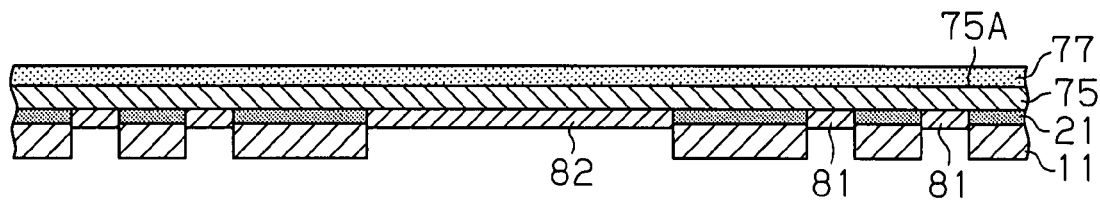
Figure 9C:
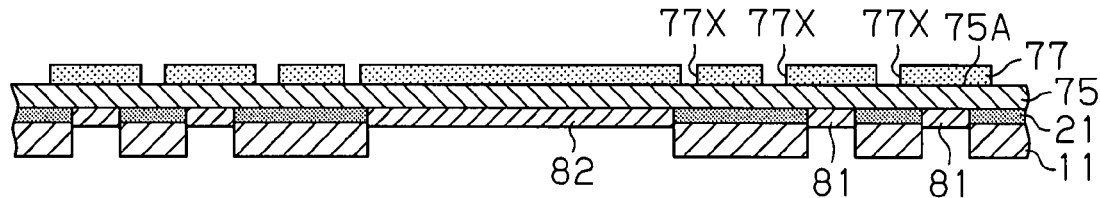

In the next step illustrated in FIG. 9B, a resist layer 77 is formed to entirely cover the upper surface 75A of the metal foil 75. Then, in the step illustrated in FIG. 9C, openings 77X corresponding to the openings 35X illustrated in FIG. 6 are formed at given locations on the resist layer 77. The material of the resist layer 77 may be the same as the resist layer 71. For example, when using a photosensitive dry film resist, thermal compression bonding is performed to laminate a dry film onto the upper surface 75A of the metal foil 75. Then, the dry film is patterned by undergoing exposure and development to form the resist layer 77 that includes the openings 77X.

Figure 9D:
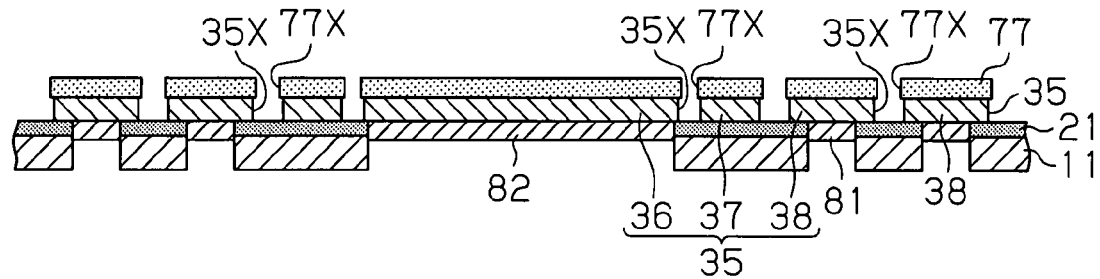

In the next step illustrated in FIG. 9D, like the etching step illustrated in FIG. 4A, the upper surface 75A of the metal foil 75 is etched using the resist layer 77 as an etching mask to form the wiring layer 35 that includes the die pad 36, the bonding pads 37, and the pads 38. More specifically, the upper surface 75A of the metal foil 75 exposed in the openings 77X of the resist layer 77 is etched to form the openings 35X that obtain the die pad 36, the bonding pads 37, and the pads 38.

Figure 10A:
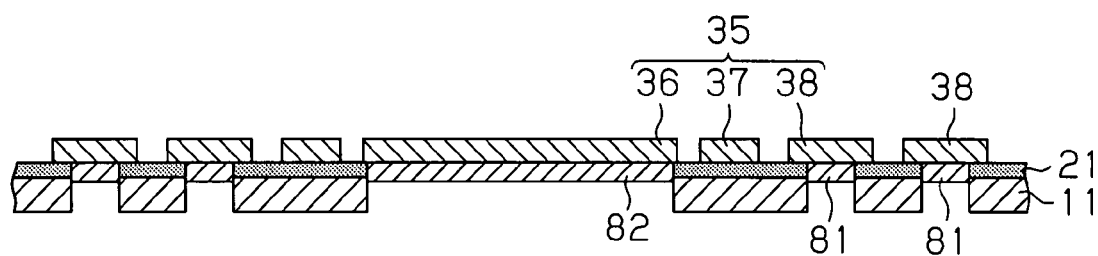

Then, in the step illustrated in FIG. 10A, the resist layer 77 illustrated in FIG. 9D is removed with, for example, an acrylic removal liquid.

Figure 10B:
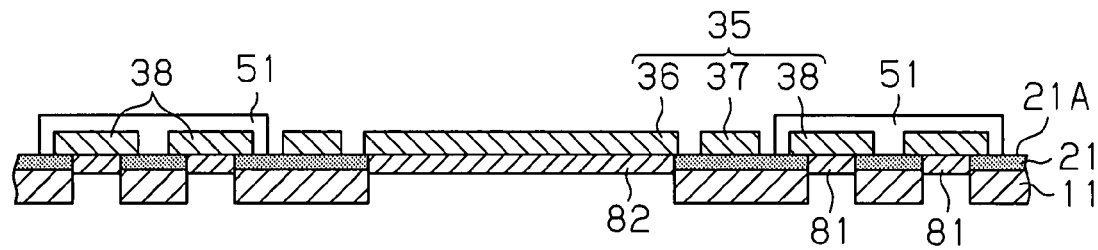

In the next step illustrated in FIG. 10B, like the step illustrated in FIG. 4C, the solder resist layer 51 is formed on the upper surface 21A of the adhesive layer 21 to cover the surfaces (upper surface and side surface) of each pad 38.

Figure 10C:
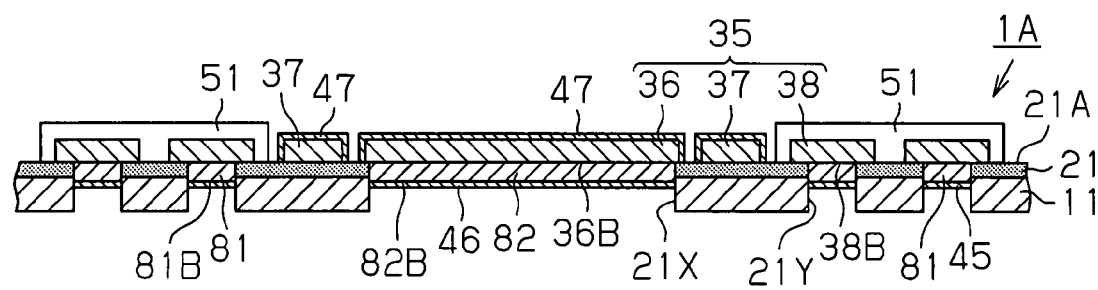

In the step illustrated in FIG. 10C, electrolytic plating is performed using each of the solder resist layer 51 and the support substrate 11 as a plating mask and the wiring layer 35 (and metal layers 81 and 82) as a plating power supply layer. The electrolytic plating forms the plating layer 45 on the lower surface 81B of the metal layer 81 exposed in the through holes 21Y, forms the plating layer 46 on the lower surface 82B of the metal layer 82 exposed in the through portion 21X, and forms the plating layer 47 on the surface (upper surface and side surface) of the die pad 36 and the bonding pads 37 exposed from the solder resist layer 51. The wiring substrate 1A illustrated in FIG. 6 is manufactured through the steps described above.

Figure 11A:
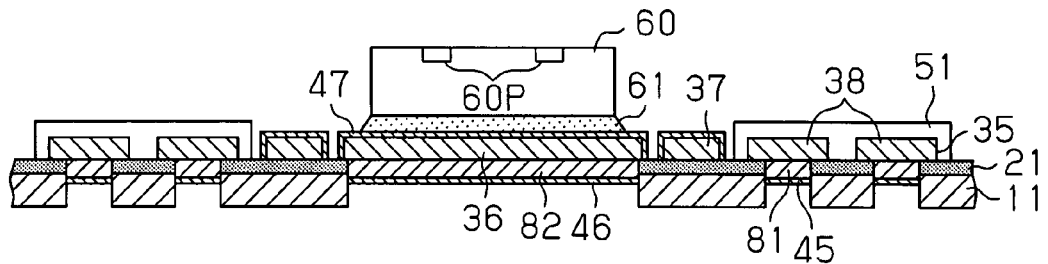
FIGS. 11A to 11D are schematic cross-sectional views illustrating procedures for manufacturing the semiconductor device in the second embodiment.

In the next step illustrated in FIG. 11A, the semiconductor element 60 is adhered with the adhesive 61 onto the plating layer 47 that covers the die pad 36. Then, in the step illustrated in FIG. 11B, the electrode pads 60P of the semiconductor element 60 are electrically connected to the bonding pads 37 (plating layer 47) with the bonding wires 62.

Figure 11B:
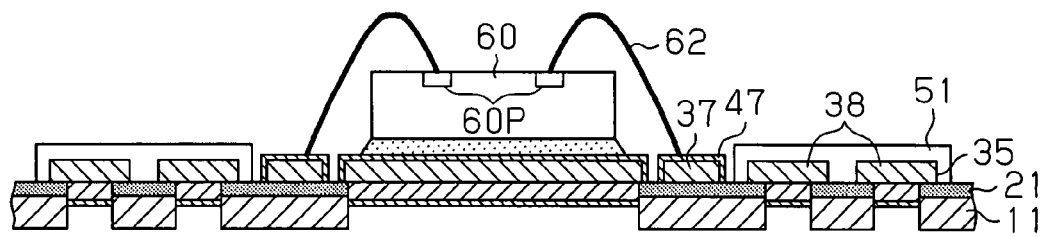
Figure 11C:
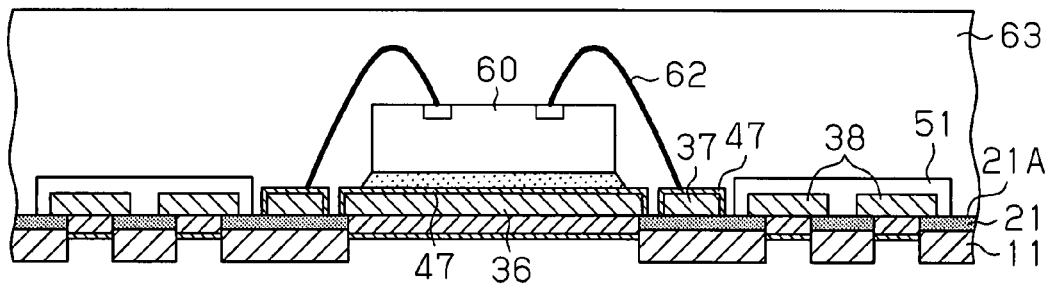

In the step illustrated in FIG. 11C, the encapsulating resin 63 is formed on the upper surface 21A of the adhesive layer 21 to encapsulate the semiconductor element 60, the bonding wires 62, the die pad 36, the bonding pads 37, the plating layer 47, and the like. When using a molding resin having a thermosetting property as the material of the encapsulating resin 63, the structure illustrated in FIG. 11B is set in a molding die. The molding die is then pressurized (e.g., 5 to 10 MPa), and fluidized molding resin is charged into the molding die. Subsequently, the resin is heated to, for example, approximately 180° C. and hardened to form the encapsulating resin 63.

Figure 11D:
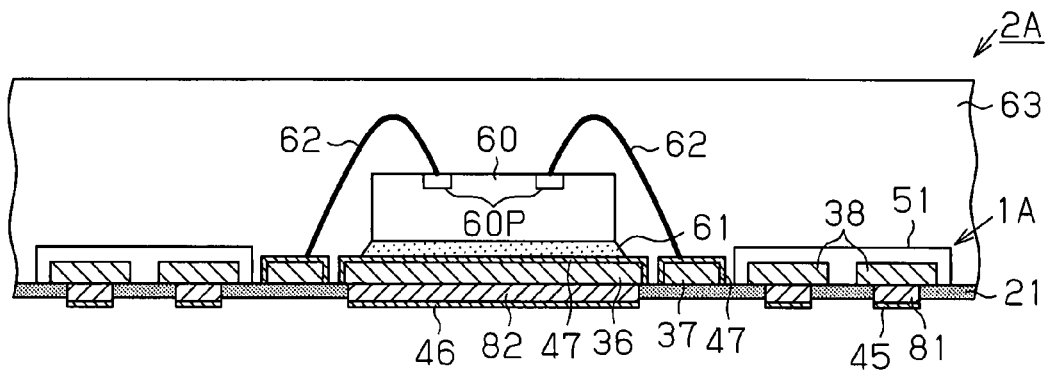

In the next step illustrated in FIG. 11D, the support substrate 11 illustrated in FIG. 11C is removed from the adhesive layer 21. For example, the support substrate 11 is mechanically removed from the adhesive layer 21. Then, the encapsulating resin 63 and the adhesive layer 21 of the structure illustrated in FIG. 11D are cut to obtain a plurality of semiconductor devices 2A. This obtains the semiconductor device 2A illustrated in FIG. 7.

The second embodiment has the advantages described below in addition to advantage (1) of the first embodiment.

(3) The metal layers 81 and 82, which are thicker than the adhesive layer 21, are formed on the through holes 21Y and the through portion 21X, and the lower surfaces 81B and 82B of the metal layers 81 and 82 project downward from the lower surface 21B of the adhesive layer 21. This allows the lower surfaces 81B and 82B of the metal layers 81 and 82 to be used as pads (external connection terminals). Thus, the semiconductor device 2A may entirely have a decreased thickness as compared to when forming external connection terminals such as solder balls to the lower surfaces 81B and 82B of the metal layers 81 and 82 (or the lower surfaces of the plating layers 45 and 46).

(4) The metal layer 82, which is directly connected to the die pad 36, is formed on the lower surface of the die pad 36. The die pad 36 and the metal layer 82 efficiently radiate the heat generated by the semiconductor element 60.

(5) When simply changing the semiconductor device 100 of the related art to an LGA type semiconductor device, a metal layer is formed on the lower surface of the wiring pattern 113, exposed in the through holes 112X, to extend through the adhesive agent 112 and the tape substrate 111 in the thicknesswise, and the metal layer projects downward from the tape substrate 111. In this case, however, the processing time for forming the metal layer is prolonged, and the manufacturing cost is increased. Further, when forming the metal layers 81 and 82 to the wiring substrate 110 (semiconductor device 100) including the tape substrate 111, the areas (volumes) of the region in which the metal layers 81 and 82 are formed differ greatly. Such an area difference has a tendency of increasing the difference in thickness between the metal layers 81 and 82. Further, when the thickness of the metal layers 81 and 82 is increased, thickness variations become prominent. Thus, if the metal layers 81 and 82 are formed when the tape substrate 111 is used, the difference in thickness between the metal layers 81 and 82 becomes prominent.

In contrast, in the second embodiment, the support substrate 11 is ultimately removed after forming the metal layers 81 and 82 that project downward from the lower surface 21B of the adhesive layer 21. Thus, even if the metal layers 81 and 82 do not project from the lower surface of the support substrate 11, the metal layers 81 and 82 project downward from the lower surface 21B of the adhesive layer 21 and thus may be used as external connection terminals. This allows for the metal layers 81 and 82, which form the external connection terminals, to be thin. Accordingly, the formation of the metal layers 81 and 82 reduces the processing time, the manufacturing costs, and variations in the thickness of the metal layers 81 and 82.

It should be apparent to those skilled in the art that the present invention may be embodied in many other specific forms without departing from the spirit or scope of the invention. Particularly, it should be understood that the present invention may be embodied in the following forms.

In each of the above embodiments, the manufacturing method obtains a plurality of wiring substrates (semiconductor devices) from a single large substrate. However, the present invention may be applied to a manufacturing method that obtains a single wiring substrate (semiconductor device). For example, in the first embodiment, a single wiring substrate 1 (and semiconductor device 2) may be produced on the support substrate 10 and the adhesive layer 20. The same applies for the other embodiment.

In each of the above embodiments, the semiconductor element 60 is wire-bonded to the wiring substrate 1 (1A). Instead, the semiconductor element 60 may be flip-chip bonded to the wiring substrate 1 (1A).

In the first embodiment, a plug plating may be formed on the lower surface 31B of each pad 31 exposed in the through hole 20X. In this case, the plug plating is thinner than the adhesive layer 20. The formation of the plug plating reduces the processing time and the manufacturing cost. Further, the formation of the plug plating ensures the bonding of the external connection terminal 65 and the pads 31.

In the second embodiment, the lower surface of the metal layers 81 and 82 project downward from the lower surface 21B of the adhesive agent 21. Instead, for example, the metal layers 81 and 82 may be formed to be thinner than the adhesive layer 21 (or have the same thickness as the adhesive agent 21), and the metal layers 45 and 46 may be formed so that the lower surfaces of the plating layers 45 and 46 project downward from the lower surface 21B of the adhesive layer 21.

In the above embodiments, the wiring substrate 1 is applied to the BGA type semiconductor device 2, and the wiring substrate 1A is applied to an LGA type semiconductor device 2A. Instead, for example, the wiring substrate 1 (1A) may be applied to a surface mounting type package of a type other than a BGA and an LGA such as a chip size package (CSP) or a small outline non-lead package (SON).

Figure 12:
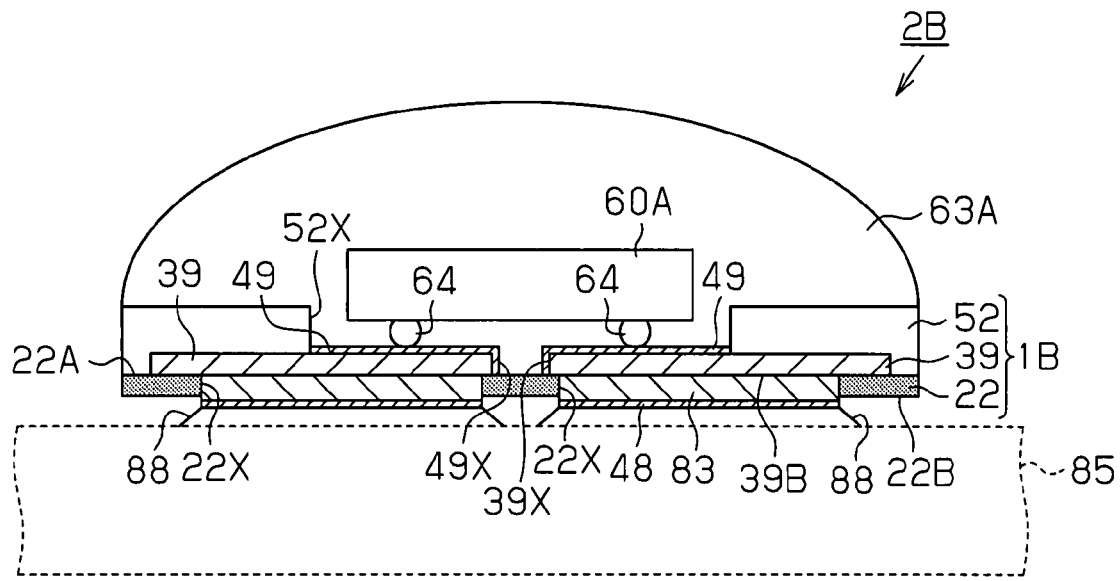
FIG. 12 is a schematic cross-sectional view illustrating a light emitting device (semiconductor device) including a wiring substrate of a modification.
Figure 13:
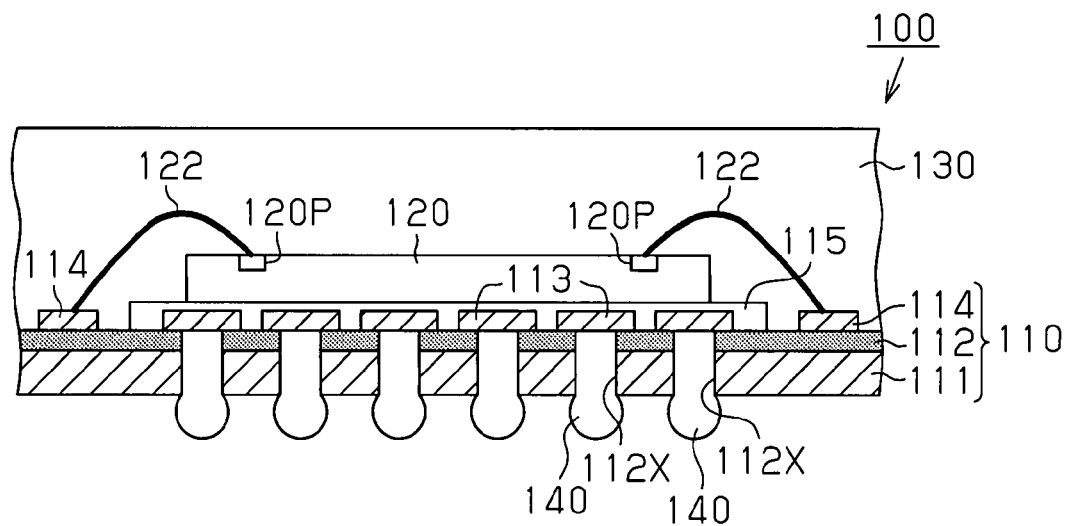
FIG. 13 is a schematic cross-sectional view illustrating a semiconductor device in a related art.

The wiring substrates 1 and 1A may be applied to a light emitting device, which is one example of a semiconductor device. FIG. 12 illustrates one example of a light emitting device that may be manufactured through the same manufacturing method as the second embodiment. In FIG. 12, a light emitting device 2B is illustrated mounted on a mounting substrate 85 such as a motherboard.

The light emitting device 2B includes a wiring substrate 1B, one or more light emitting elements 60A flip-chip bonded to the wiring substrate 1B, and an encapsulating resin 63A that encapsulates the light emitting element 60A or the like. In the example of FIG. 12, the light emitting element 60A is flip-chip bonded to the wiring substrate 1B but may be wire-bonded to the wiring substrate 1B.

The wiring substrate 1B includes an adhesive layer 22, wiring patterns 39, a metal layer 83, plating layers 48 and 49, and a solder resist layer 52. The adhesive layer 22, the wiring patterns 39, the metal layer 83, the plating layers 48 and 49, and the solder resist layer 52 may respectively be manufactured in the same manner as the adhesive layer 21, the pads 38, the metal layer 81, the plating layers 45 and 47, and the solder resist layer 51.

The wiring pattern 39 is formed on an upper surface 22A (first surface) of the adhesive layer 22. The same material as the adhesive layer 21 may be used as the material of the adhesive layer 22. In the same manner as the adhesive layer 21, the adhesive layer 22 functions to adhere the wiring patterns 39 and a support substrate during manufacturing. That is, during manufacturing, the support substrate corresponding to the support substrate 11 is adhered in a removable manner to the lower surface 22B (second surface) of the adhesive layer 22.

The adhesive layer 22 includes a plurality of (two in FIG. 12) through holes 22X. The through holes 22X extend through the adhesive layer 22 in the thicknesswise direction. The positions of the through holes 22X correspond to the mount region of the light emitting element 60A. Further, the through holes 22X expose portions of a lower surface 39B of the wiring pattern 39. Each of the through holes 22X is, for example, tetragonal as viewed from above.

The wiring patterns 39 are overlapped with the through holes 22X as viewed from above. Each wiring pattern 39 has a larger size that the corresponding through hole 22X. Thus, a portion of the lower surface 39B of each wiring pattern 39 is adhered to the adhesive layer 22, and the remaining portion of the lower surface 39B is exposed in the through hole 22X. The lower surface 39B of each wiring pattern 39 is roughened to include microscopic ridges and valleys.

Each wiring pattern 39 is, for example, tetragonal as viewed from above. The wiring patterns 39 are arranged in parallel and adjacently. Openings 39X separate the wiring patterns 39. Copper or copper alloy, for example, may be used as the material of the wiring pattern 39.

The metal layer 83 covers the lower surface 39B of the wiring pattern 39 exposed in the through hole 22X. The metal layer 83 projects from the lower surface 22B of the adhesive layer 22. That is, the metal layer 83 is thicker than the adhesive layer 22. For example, copper or copper alloy may be used as the material of the metal layer 83.

The plating layer 48 covers the lower surface of the metal layer 83. The plating layer 48 is electrically connected to external connection pads arranged on the mounting substrate 85 by, for example, a solder 88. The metal layer 83 and the plating layer 48 function as an external connection terminal (electrode) used when mounting the light emitting device 2B to the mounting substrate 85 such as a motherboard. Accordingly, the metal layer 83 and the plating layer 48 are supplied with power from an external power supply device through wires of the mounting substrate and external connection pads or the like. One example of the plating layer 48 is a metal layer (Ni/Au layer or the like) similar to that of the plating layer 45.

The solder, resist layer 52 is formed on the upper surface 22A of the adhesive layer 22 to cover the wiring patters 39. An opening 52X is formed in the solder resist layer 52 at a position corresponding to the mount region of the light emitting element 60A to expose the wiring patterns 39 and the adhesive layer 22. A plating layer 49 is formed to cover the wiring patterns 39 exposed in the opening 52X. The plating layer 49 is, for example, tetragonal as viewed from above. The plating layer 49 is separated into two adjacent portions by an opening 49X. The wiring patterns 39 (the plating layer 49), which are exposed in the opening 52X, function as connection pads for bonding the light emitting element 60A. That is, the wiring patterns 39 (the plating layer 49) are used as a mount unit for mounting the light emitting element 60A, and connected to the metal layer 83 that serves as electrodes. One example of the plating layer 49 is a metal layer (Ni/Au layer or the like) similar to that of the plating layer 47.

The solder resist layer 52 may be a reflective film having a high reflectivity. For example, a reflective film having a wavelength from 450 to 700 nm and a reflectivity of 50% or greater (preferably 80% or greater) may be used as the solder resist layer 52. Such a solder resist layer 52 is referred to as a white resist layer or a reflective layer. In this case, for example, a white insulative resin may be used as the material of the solder resist layer 52. The white insulative resin may be a resin material in which a filler or pigment of white titanium oxide ($TiO_2$) or barium sulfate ($BaSO_4$) is included in an epoxy resin or an organopolysiloxane resin. Further, a black insulative resin may be used as the material of the solder resist layer 52. The black insulative resin may be, for example, an opaque black resist obtained by mixing a photosensitive material in an opaque black resin. For example, a black pigment may be carbon black, titanium black, or a mixture of multiple types of pigments.

The light emitting element 60A is flip-chip bonded to two adjacent plating layers 49 to extend over the opening 49X between the adjacent plating layers 49. More specifically, bumps 64 formed on one surface (lower surface in FIG. 12) of the light emitting element 60A are flip-chip bonded to the plating layers 49. This electrically connects the light emitting element 60A to the metal layer 83 and the plating layer 48 via the plating layer 49 and the wiring pattern 39. The light emitting element 60A emits light when supplied with power from an external power supply (not illustrated) via the mounting substrate 85, the plating layer 48, the metal layer 83, the wiring pattern 39, the plating layer 49, and the like.

The light emitting element 60A may be, for example, a light emitting diode (LED) or a vertical cavity surface emitting laser (VCSEL). The bumps 64 may be, for example, gold bumps or solder bumps. The material of the bumps 64 may be, for example, an alloy including lead (Pb), an alloy of tin (Sn) and Au, an alloy of Sn and Cu, an alloy of Sn and Ag, and an alloy of Sn, Ag, and Cu.

The encapsulating resin 63A is formed on the upper surface 22A of the adhesive layer 22 to encapsulate the light emitting element 60A, the bumps 64, the plating layer 49, and the like. The material of the encapsulating resin 63A may be a resin material obtained by including a fluorescent substance in silicone resin. By forming a resin material including such a fluorescent substance on the light emitting element 60A, colors may be mixed with the light emission of the light emitting element 60A and the light emission of the fluorescent substance. This allows for the light of the light emitting device 2B to be controlled in various colors.

Such a structure has the same advantages as the second embodiment. Further, the metal layer 83 is formed on the lower surface 39B of the wiring pattern 39. The wiring pattern 39 and the metal layer 83 form an electrode that extends from the upper surface 22A to the lower surface 22B of the substrate (adhesive layer 22) on which the light emitting element 60A is mounted. This allows for radiation of the heat generated by the light emitting element 60A with the metal layer 83 and the plating layer 48 that function as an electrode and thereby improves the radiation efficiency. Further, the plating layer 48 projecting downward from the lower surface 22B of the adhesive layer 22 is directly connected to the external connection pads of the mounting substrate 85. This allows for reduction in size of the entire light emitting device 2B as compared with when using bonding wires or the like to electrically connect the electrodes of the wiring substrate 1B to the mounting substrate 85.

Clauses

This disclosure further encompasses various examples described below.

1. A method for manufacturing a wiring substrate, the method comprising:

preparing a support substrate, wherein the support substrate includes a surface on which an adhesive layer is formed;

forming a through hole that extends through the support substrate and the adhesive layer;

adhering a metal foil to the adhesive layer; and forming a wiring layer by patterning the metal foil, the wiring layer including a pad that is a portion of the metal foil exposed in the through hole, wherein the support substrate is adhered to the adhesive layer in a removable manner.

2. The method according to clause 1, further comprising:

forming a masking material on the metal foil after adhering the metal foil;

forming a first metal layer that covers the portion of the metal foil exposed in the through hole and functioning as the pad; and removing the masking material.

3. The method according to clause 2, wherein the forming a through hole includes forming a through portion that extends through the support substrate and the adhesive layer in the thicknesswise direction at the same time as when the through hole is formed, the forming a first metal layer includes forming a second metal layer that covers another portion of the metal foil exposed in the through portion and functioning as a die pad at the same time as when the first metal layer is formed, and the forming the wiring layer includes patterning the metal foil to form the die pad that is exposed in the through portion and the pad that is exposed in the through hole.

4. The method according to clause 3, further comprising:

forming a solder resist layer on the adhesive layer to cover a portion of the wiring layer after forming the wiring layer; and forming a plating layer that covers the wiring layer, the first metal layer, and the second metal layer by performing an electrolytic plating process that uses each of the solder resist layer and the support substrate as a mask and uses a remaining portion of the wiring layer as a power supply layer.

5. The method according to clause 1, wherein the adhering a metal foil includes adhering the metal foil to the adhesive layer through a heat process by using an adhesive of which adhesive force adhering the adhesive layer to the support substrate decreases when undergoing the heat process 6. A method for manufacturing a semiconductor device, the method comprising:
preparing a support substrate, wherein the support substrate includes a surface on which an adhesive layer is formed;
forming a through hole that extends through the support substrate and the adhesive layer;
adhering a metal foil to the adhesive layer; and
forming a wiring layer by patterning the metal foil, wherein the wiring layer includes a pad that is a portion of the metal foil exposed in the through hole;
mounting a semiconductor element on the wiring layer;
forming an encapsulating resin on the adhesive layer to encapsulate the semiconductor element and the wiring layer; and
removing the support substrate from the adhesive layer.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
an adhesive layer including a first surface and a second surface that is opposite to the first surface;
a wiring layer formed on the first surface of the adhesive layer; and
a support substrate formed on the second surface of the adhesive layer, wherein
the wiring layer is partially exposed in a through hole extending through the adhesive layer and the support substrate in a thickness-wise direction, and
the support substrate is adhered to the adhesive layer in a removable manner such that the support substrate is peelable from the adhesive layer,
wherein the adhesive layer is a thermally cured adhesive layer that has a first adhesive force that adheres the wiring layer to the adhesive layer and a second adhesive force that adheres the support substrate to the adhesive layer, and the first adhesive force is stronger than the second adhesive force.

2. The wiring substrate according to claim 1, further comprising a first metal layer that covers a portion of the wiring layer exposed in the through hole that extends through the adhesive layer and the support substrate in the thickness-wise direction, wherein the first metal layer is relatively thicker than the adhesive layer and does not extend beyond the through hole.

3. The wiring substrate according to claim 1, wherein the wiring layer includes a die pad on which a semiconductor element is mounted, the die pad being partially exposed in a through portion that extends through the adhesive layer and the support substrate in the thickness-wise direction, and
the wiring substrate further comprises a second metal layer that covers the die pad exposed from the through portion, wherein the second metal layer is thicker than the adhesive layer.

4. The wiring substrate according to claim 1, wherein the adhesive layer has a thickness of 5 μm to 20 μm.

5. The wiring substrate according to claim 1, wherein the wiring layer includes an upper surface and a lower surface,
the lower surface of the wiring layer is a roughened surface that is relatively rougher than the upper surface of the wiring layer, and
the roughened surface of the wiring layer is adhered to the first surface of the adhesive layer.

6. The wiring substrate according to claim 1, wherein the adhesive layer is formed from an epoxy resin material, a polyimide resin material, or a silicone resin material.

7. The wiring substrate according to claim 1, wherein the support substrate is formed of a tape substrate, the tape substrate being a polyimide resin film or a polyphenylene sulfide resin film.

8. The wiring substrate according to claim 1, wherein the support substrate is formed of a glass plate.

9. The wiring substrate according to claim 1, further comprising a solder resist layer arranged on the first surface of the adhesive layer to cover the wiring layer, wherein the wiring layer includes a pad exposed from the solder resist layer.

10. The wiring substrate according to claim 1, wherein the wiring layer includes a pad exposed from the through hole that extends through the adhesive layer and the support substrate in the thickness-wise direction.

* * * * *